United States Patent [19]

Lin et al.

[11] Patent Number: 5,406,284
[45] Date of Patent: Apr. 11, 1995

[54] METHODS AND APPARATUS FOR THE QUANTIZATION AND ANALOG CONVERSION OF DIGITAL SINGNALS

[75] Inventors: Kun Lin; George J. Radda, both of Tucson, Ariz.

[73] Assignee: Monolith Technologies Corporation, Tucson, Ariz.

[21] Appl. No.: 997,722

[22] Filed: Dec. 31, 1992

[51] Int. Cl.[6] .............................................. H03M 1/66
[52] U.S. Cl. .................................... 341/144; 341/152
[58] Field of Search ................ 341/143, 144, 152, 145

[56] References Cited

U.S. PATENT DOCUMENTS

| | | | |
|---|---|---|---|
| 4,452,371 | 9/1985 | Uchikoshi | 341/152 |
| 4,467,316 | 8/1984 | Musmann et al. | 341/144 |
| 4,536,743 | 8/1985 | Uchikoshi | 341/152 |
| 4,901,077 | 2/1990 | Christopher | 341/143 |
| 5,008,675 | 4/1991 | Toyomaki | 341/152 |
| 5,021,788 | 6/1991 | Ueki et al. | 341/152 |
| 5,148,168 | 9/1992 | Masuda et al. | 341/152 |
| 5,243,346 | 9/1993 | Inami | 341/144 |
| 5,270,716 | 12/1993 | Gleim | 341/145 |

*Primary Examiner*—Marc S. Hoff
*Attorney, Agent, or Firm*—Snell & Wilmer

[57] ABSTRACT

A digital-to-analog converter (DAC) for generating a pulse width modulated (PWM) signal. A dual-DAC implementation includes a read-only memory (ROM) containing a plurality of addressable output signals, respective shift left and shift right registers configured to simultaneously receive an output signal from the ROM, and respective first and second DACs are configured to receive the left shifted output and right shifted output, respectively, from the shift left and shift right registers. Both DAC outputs are applied to an analog summer which generates an output signal indicative of the sum of the outputs from the two DACs.

14 Claims, 7 Drawing Sheets

| 4 MSB's IN 2's COMPLEMENT | 4 TO 16 | 3 TO 8 | 3 TO 7 |
|---|---|---|---|
| 1000 | — | | |
| 1001 | — | | |
| 1010 | — | — | |
| 1011 | — | | |
| 1100 | — | — | |
| 1101 | — | | — |
| 1110 | — | — | — |
| 1111 | — | | — |
| 0000 | — | — | — | (MID-SCALE)
| 0001 | — | | — |
| 0010 | — | — | — |
| 0011 | — | | — |
| 0100 | — | — | |
| 0101 | — | | |
| 0110 | — | — | |
| 0111 | — | | |

MID RANGE VALUES: { 1101, 1110, 1111, 0000, 0001, 0010, 0011 }

FIG. 7

METHODS AND APPARATUS FOR THE QUANTIZATION AND ANALOG CONVERSION OF DIGITAL SINGNALS

CROSS-REFERENCE TO RELATED APPLICATION

This application is filed concurrently with U.S. Ser. No. 08/029,870, entitled "Digital-To-Analog Converter Including Integral Digital Audio Filter", the entire disclosure of which is incorporated herein.

TECHNICAL FIELD

The present invention relates, generally, to methods and apparatus for oversampling, quantizing and noise shaping digital data and thereafter applying the data to a pulse width modulated digital-to-analog converter (DAC), and particularly to techniques for generating and centering the DAC input data within a sample period.

BACKGROUND ART AND TECHNICAL PROBLEMS

Sigma-delta modulators (noise shapers) are often used as input stages for a pulse width modulator (PWM) in many applications, such as audio play back systems. More particularly, digital audio data is often stored on a disk, for example on a CD ROM, from which the data is retrieved and processed before being reconverted back to an analog audio signal.

To enhance the quality of the reproduced audio signal, the data is often "over-sampled," i.e., data points which were not originally extracted from the analog audio signal are interpolated in interpose between the data points which are retrieved from the CD disc. Various oversampling techniques are employed in the context of audio play back systems, for example digital interpolation using a finite impulse response (FIR) filter, which may generate interpolated data on the order of four to eight times that of the original digital data.

Another method for oversampling digital data involves the use a delta-sigma modulator (noise shapers) configured to oversample the data, again on the order of four to eight times the number of data points input to the noise shaper per unit time period. Digital data are applied to noise shapers, for example in the form of N data words at a predetermined sampling frequency Fs, and output more coarsely quantized data at a higher sampling rate. For example, a typical noise shaper may convert 16-bit data input at 8 Fs to 4-bit data at 32 Fs.

The 4-bit data output from the noise shaper may then be conveniently applied to a PWM module to effect sound reproduction of the oversampled digital data. Presently known noise shapers are configured to extract on the order of three or four most significant bits (MSBs) from a data signal, and apply the remaining least significant bits (LSBs) to a digital filter. By low pass filtering the least significant bits and thereafter summing the filtered LSBs with new input data, a coarsely quantized representation of the original data may be extracted at a frequency which is an integer multiple of the frequency at which the original data is input to the noise shaper. The coarsely quantized data is thereafter employed to address a ROM, from which predetermined data signals are retrieved and applied to a 1-bit DAC for subsequent application to an audio transducer.

Presently known noise shaping modules are disadvantageous in several respects. For example, conventional adders employed in known noise shapers are not equipped to output a carry bit. Thus, the adder may overflow if the sum of the input data to the adder exceeds the output capacity of the adder, resulting in corruption of the signal data applied to the audio transducer.

Presently known dual DAC pulse width modulator (PWM) systems are disadvantageous in that they often employ two separate ROMs for the purpose of simultaneously producing two separate signal outputs which are subsequently fed to respective independent shift registers and respective 1-bit DACs, the outputs of which are thereafter summed to produce a composite output signal. The circuitry required to implement these functions, and the propagation delay introduced thereby, limit the performance of known PWM modules.

A noise shaper and associated PWM module are needed which overcome the limitations of the prior art.

SUMMARY OF THE INVENTION

The present invention provides methods and apparatus for configuring a noise shaper and a PWM module in a manner which overcomes the shortcomings of the prior art. In accordance with one aspect of the present invention, the data which is input to the noise shaper is appropriately scaled, to thereby prevent the adder within the noise shaper from computing a summed value which exceeds the output capacity of the adder. In accordance with a further aspect of the invention, this pre-scaling feature permits the quantizer associated with the noise shaper to output more coarsely quantized data (i.e., fewer significant bits) from the noise shaper. By using fewer output bits from the noise shaper, i.e., by utilizing more coarsely quantized data, substantially smaller decoders and adders may be employed, thereby conserving "real estate" and increasing processing speed.

In accordance with a further aspect of the invention, a dual PWM architecture is employed, which permits a single address to be applied to a single ROM, resulting in a single output signal from the ROM. In accordance with a particularly preferred embodiment, the single output signal retrieved from ROM is simultaneously latched into two separate shift registers. The data within the first shift register is serial shifted left and applied to a first 1-bit DAC; the data from the second shift register is serial shifted right and applied to a second 1-bit DAC. The two outputs produced in this fashion, when summed, yield specifically an output pulse which is centered within each pulse window. The outputs from the foregoing 1-bit DACs are applied to a voltage adder to thereby produce a composite signal corresponding to the outputs from the two DACs. Thus, the function of a dual DAC architecture is replicated while only accessing a single ROM once per computational period. The contents of ROM may be suitably chosen to reduce quantization noise in the frequency band of interest.

In accordance with a further aspect of the invention, appropriate scaling of the data input to the noise shaper results in coarsely quantized data which is limited to a predetermined magnitude range. Moreover, within this range, the first two MSBs of the coarsely quantized data are equal, permitting the use of three of the four MSBs of the coarsely quantized signal as the argument to the ROM (as opposed to using all four MSBs), thereby reducing the complexity of the ROM address decoding logic.

BRIEF DESCRIPTION OF THE DRAWING FIGURES

The present invention will hereinafter be described in conjunction with the appended drawing figures, wherein like numerals denote like elements;

FIG. 7 is a diagrammatic representation of the effect of scaling the data as shown in FIG. 1.

DETAILED DESCRIPTION OF PREFERRED EXEMPLARY EMBODIMENTS

Figure 1:
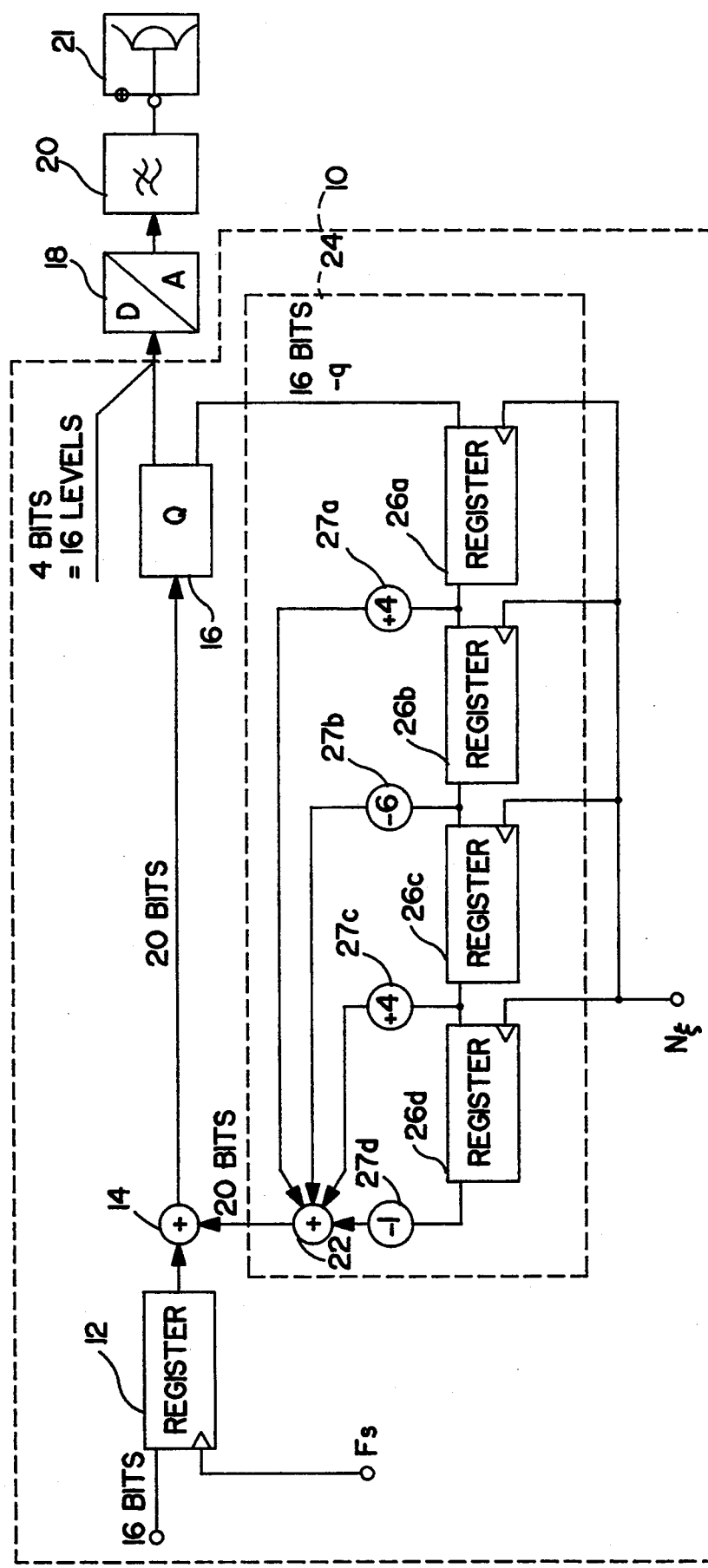
FIG. 1 is a schematic representation of a prior art noise shaper, DAC, and audio transducer.

Referring now to FIG. 1, presently known noise shaping systems 10 typically comprise an input register 12, an input summing junction (adder) 14, a quantizer 16, and a filter 24. The output of noise shaper 10 is suitably applied to a digital-to-analog converter (DAC) 18, with the resulting analog signal being applied to a low pass filter 20, and thereafter to a transducer 21, for example a conventional audio play back speaker.

Input data, for example, 16-bit digital audio data, is applied to register 12 at a first frequency Fs. The output of register 12 is applied to first summing junction 14, where it is summed with the output of filter 24. The 20-bit output from first summing junction 14 is applied to quantizer 16.

Quantizer 16 is configured to strip off a predetermined number of the most significant bits (MSBs) comprising the data applied thereto. In the illustrated example, quantizer 16 extracts the four most significant bits and applies the 4-bit signal to DAC 18; the remaining 16 least significant bits, i.e., the remaining sixteen LSBs, are applied to filter 24.

Filter 24 typically comprises a conventional finite impulse response (FIR) filter formed of a plurality of registers 26A–D and a second summing junction 22. Filter 24 suitably operates at a frequency nFs where n is an integer which defines the characteristic over-sampling frequency of noise shaper 10 and generates an output, a predetermined number of bits in length, typically 20. For example, if n equals 6, second summing junction 22 will output an interpolated data word at a frequency six times greater than the rate at which new input data is applied to register 12. As a result, each data word applied to register 12 is summed (at first summing junction 14) with an output from filter 24 six different times.

Each of respective registers 26A–D has associated therewith one of respective coefficients 27A–27D. The output of quantizer 16 is applied to register 26A at a rate of nFs. During each cycle of operation of filter 24 (i.e., at a frequency of nFs), the contents of register 26A are multiplied by coefficient 27A and applied to second summing junction 22. Also during each cycle of operation of filter 24, the contents of respective registers 26A–C are applied to the next successive registers 26B–D, and so on, such that the output of second summing junction 22 comprises the sum of the contents of each register 26A–D multiplied by a respective coefficient 27A–27D associated therewith.

The output of noise shaper 10 comprises the four most significant bits of the input to quantizer 16. The foregoing over-sampling/quantizing operations necessarily introduce quantization noise into the data. Moreover, the amplitude of the quantization noise is inversely related to the degree of quantization; that is, a 1- or 2-bit quantizer introduces more noise than a 3- or 4-bit quantizer. Thus, typical quantizers used in noise shaped, over-sampled DACs, such as quantizer 16, generally extract on the order of three to four bits from the data, resulting in acceptable levels of quantization noise in band while shifting excess quantization noise out of band.

More particularly, a large percentage of the quantization noise introduced into the data by quantizer 16 may be shifted to the high frequency range (and thus eliminated by low pass filter 20) by proper selection of coefficients 27A–27D. See, e.g., Musman et al. U.S. Pat. No. 4,467,316 issued Aug. 21, 1984, the entire contents of which are incorporated herein by this reference.

The extent to which the quantization noise may be effectively shifted into high frequency regions is a function of the order of filter 24. Higher order filters are capable of effecting more dramatic shifts, but are generally more difficult to stabilize. Thus, a designer must select a filter order which assures stable operation yet at the same time shifts a sufficient amount of quantization noise to the high frequency range.

In audio applications, it is desirable to shift the quantization noise out of the audible range, for example, to frequencies higher than 20 kilohertz. The data may thereafter be passed through a low pass filter (e.g., filter 20) to eliminate most of the unwanted quantization noise.

Figure 2:
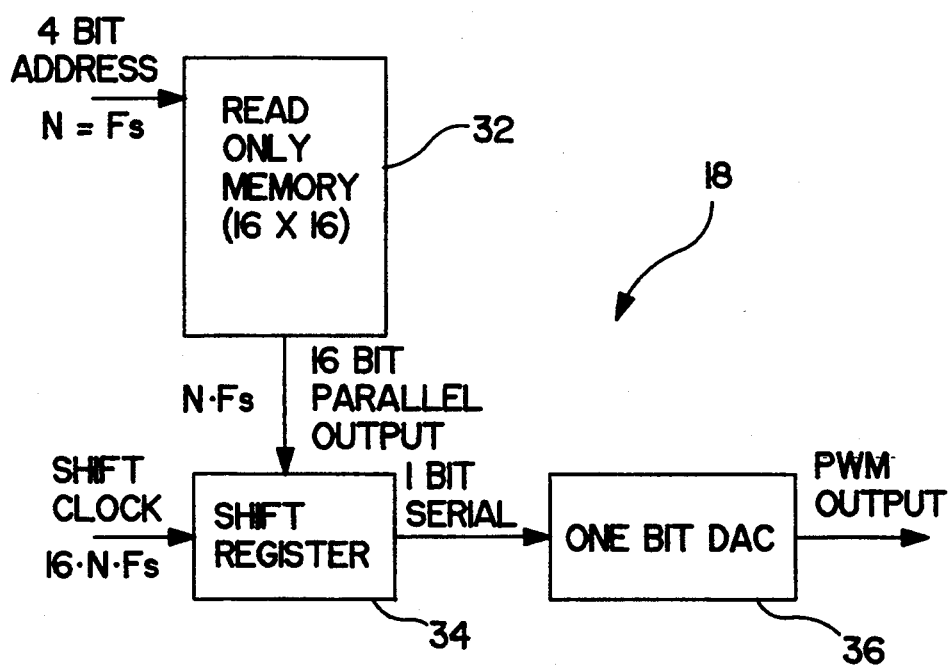
FIG. 2 is a schematic block diagram representation of the prior art DAC shown in FIG. 1.

Referring now to FIG. 2, a conventional prior art DAC 18 suitably comprises a ROM 32, a shift register 34, and a 1-bit DAC 36.

The output from quantizer 16 (FIG. 1), comprising a 4-bit signal at a frequency of nFs, is applied to ROM 32. In the illustrated embodiment wherein a 4-bit address is employed, ROM 32 suitably comprises a 16×16 lookup table, wherein each of the sixteen possible combinations of the 4-bit input signal ($2^4=16$) corresponds to a unique address within ROM 32. The 4-bit argument (address signal) selects a unique 16-bit output signal pattern, and applies this output signal pattern to shift register 34. Shift register 34 is suitably clocked at a frequency which is M times that of the input to ROM 32, where M corresponds to the number of bits comprising each word output from ROM 32. In the illustrated example, shift register 34 is suitably clocked at a rate of 16 times (M=16) the rate at which the 4-bit words are applied to ROM 32 (i.e., 16 nFs. In this way, shift register 34 may output, in 1-bit serial fashion, each 16-bit word from ROM 32 during each operational period P of ROM 32 (P=1/nFs).

The 1-bit serial output from shift register 34 is applied to 1-bit DAC 36, to thereby generate an analog output signal. This output signal is typically passed through low pass filter 20 (FIG. 1) to eliminate the quantization noise shifted to the high frequency range by noise shaper 10, and thereafter to a conventional amplifier (not shown) and ultimately to speaker 21.

Figure 4:
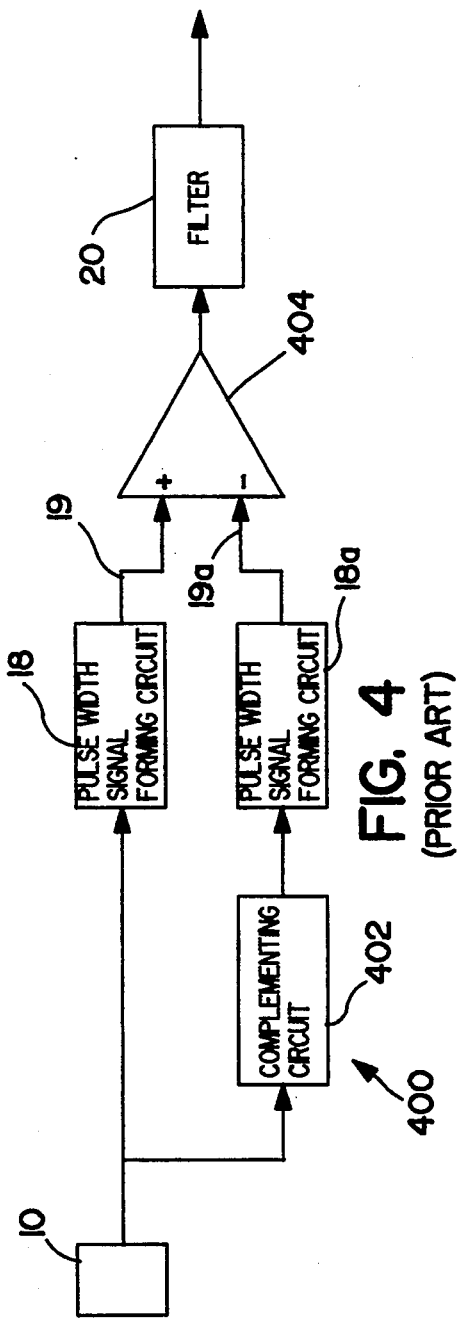
FIG. 4 is a prior art dual DAC architecture illustrating a complementing circuit, two signal forming circuits, a voltage adder, and a filter.

Referring now to FIG. 4, presently known pulse width modulator (PWM) circuits often employ a dual DAC architecture 400, comprising respective, suitably identical, signal forming circuits 18 and 18a typically of the type shown in FIG. 2; a complementing circuit 402 cooperating with one of the forming circuits (e.g., circuit 18a); a summing module 404; and a low pass filter 20. The 4-bit output from noise shaper 10 is simultaneously applied to signal forming circuit 18 and to complementing circuit 402. Complementing circuit 402 suitably complements the 4-bit address input thereto, for example by taking the 2's complement of the address. The complemented output from complementor 402 is thereafter applied to signal forming circuit 18a. With momentary reference to FIG. 2, signal forming circuit 18a applies the 4-bit (uncomplemented) address to its internal ROM 32 and outputs a first signal 19; signal forming circuit 18a applies the complemented address to its internal ROM 32 to thereby generate a second output signal 19a. Output signals 19 and 19a are then applied to summing module 404, whereupon the output of module 404 is applied to low-pass filter 20 and ultimately to speaker 21 (See FIG. 1). The foregoing dual DAC architecture, however, requires two support ROMs, shift register and DACs.

The output from a particular DAC, i.e., one of the 16-bit signals retrieved from ROM 32, may or may not be symmetrically disposed about the center of a computational period P=1/nFs. For example, while a 16-bit word is output from 1-bit DAC 36 (FIG. 2) during each cycle of operation of DAC 18, namely during each period P, the 16-bit word may not be centered within the window defined by period P. A high frequency succession of such uncentered voltage signals tends to introduce noise into the signal output from filter 20. While the noise is typically of a high frequency nature which would not adversely affect the output of 1-bit DAC 36 in many applications, e.g. motor controls, such noise has a deleterious effect on the fidelity of audio signals.

Moreover, even systems wherein the data retrieved from ROM 32 is centered within a computational period P, the circuitry required to apply an uncomplemented address and a complemented address to, and to retrieve two separate signals from, respective ROMs, results in undesirable propagation delay and/or excessive "real estate" consumed by the components necessary to implement these systems.

Figure 3:
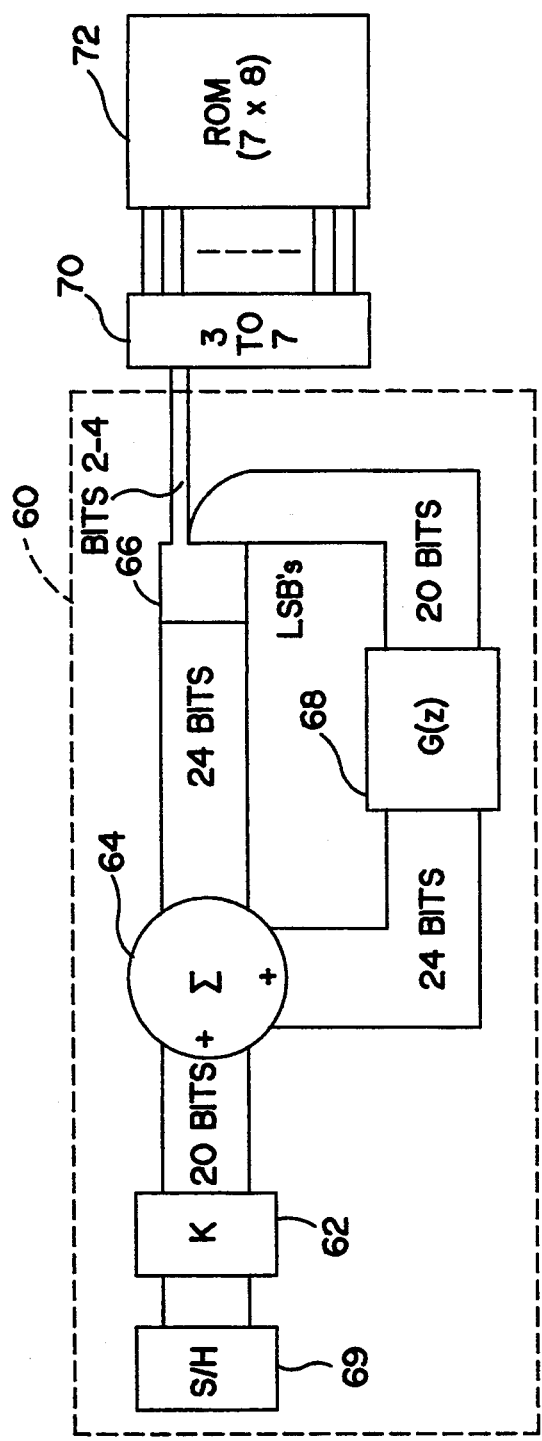
FIG. 3 is a schematic functional diagram of a noise shaper, decoder and ROM in accordance with the present invention.
Figure 6:
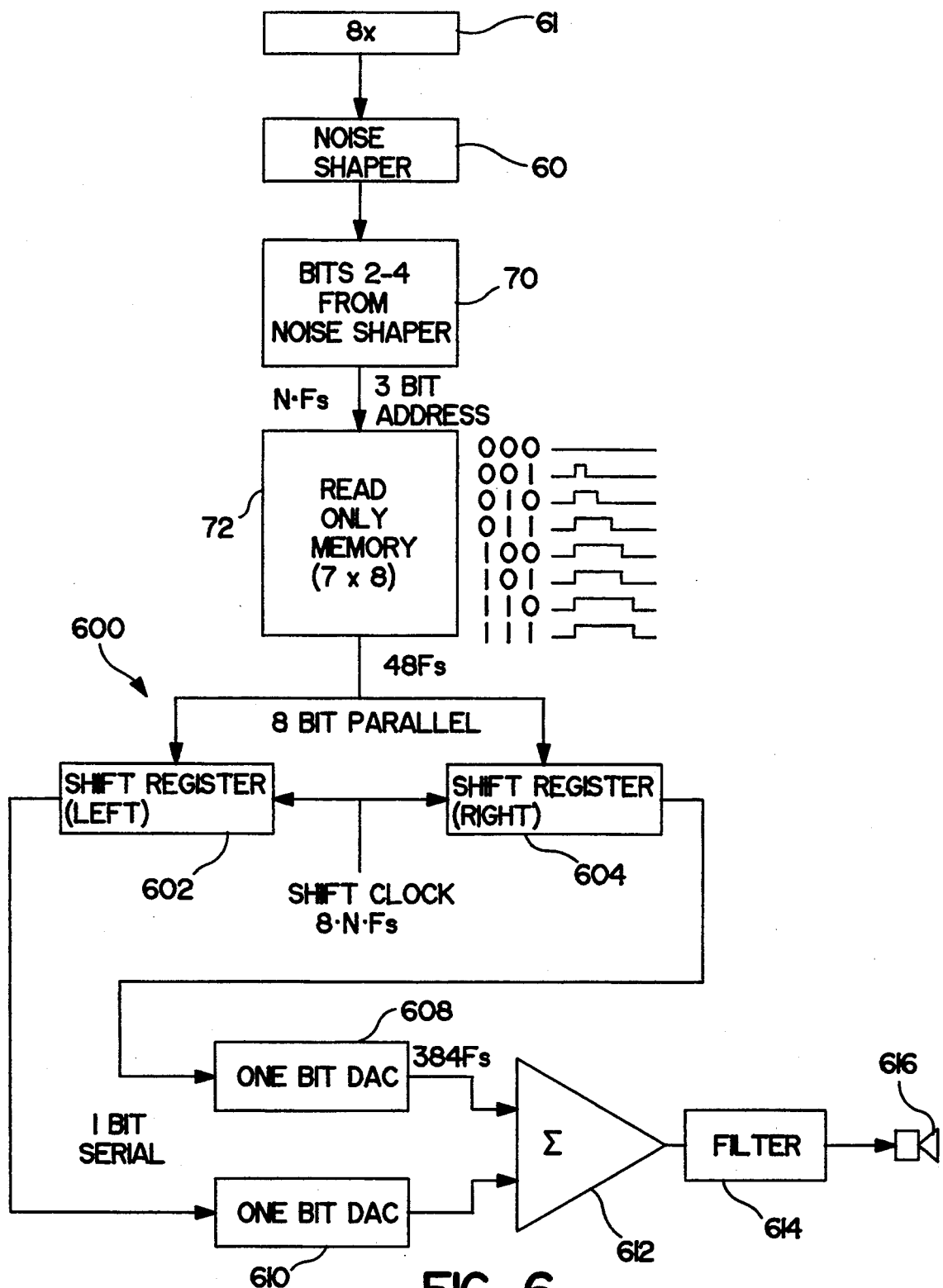
FIG. 6 is a functional block diagram representation of the dual DAC architecture employed in accordance with a preferred embodiment of the present invention.

Referring now to FIGS. 3 and 6, an improved DAC architecture in accordance with the present invention functions to, inter alia, center the pulse width modulating signal within a computational period P with a minimum of circuit components.

With particular reference to FIG. 3, an exemplary noise shaper 60 in accordance with the present invention suitably comprises a sample and hold register 69, a scaling module 62, an adder 64, a quantizer 66, and a filter 68. Filter 68 suitably effects a function (G(z)), generally analogous to the function performed by filter 24 of FIG. 1. In a preferred embodiment of the present invention, however, multiplierless architecture is employed; accordingly, multiplication is effected through a shift-and-add technique described in detail in co-pending U.S. patent application Ser. No. 07/889,134, filed May 26, 1992 and entitled "Methods and Apparatus for Implementing a Digital Filter Employing Coefficients Expressed as Sums of 2 to an Integer Power", the entire disclosure of which is incorporated herein by this reference.

The output of noise shaper 60 is suitably applied to a demultiplexer (address decoder) 70 which is configured to select a particular address from a ROM 72. More particularly, quantizer 66 suitably extracts predetermined MSBs from the feedback loop comprising quantizer 66 and applies these bits to demultiplexer 70. In response, demultiplexer 70 selects a particular address within ROM 72 corresponding to one of seven predetermined 8-bit signals which defines the proportion of each computational window during which the 1-bit DAC assumes a high logic state (i.e., the width of the output pulse).

Figure 5:
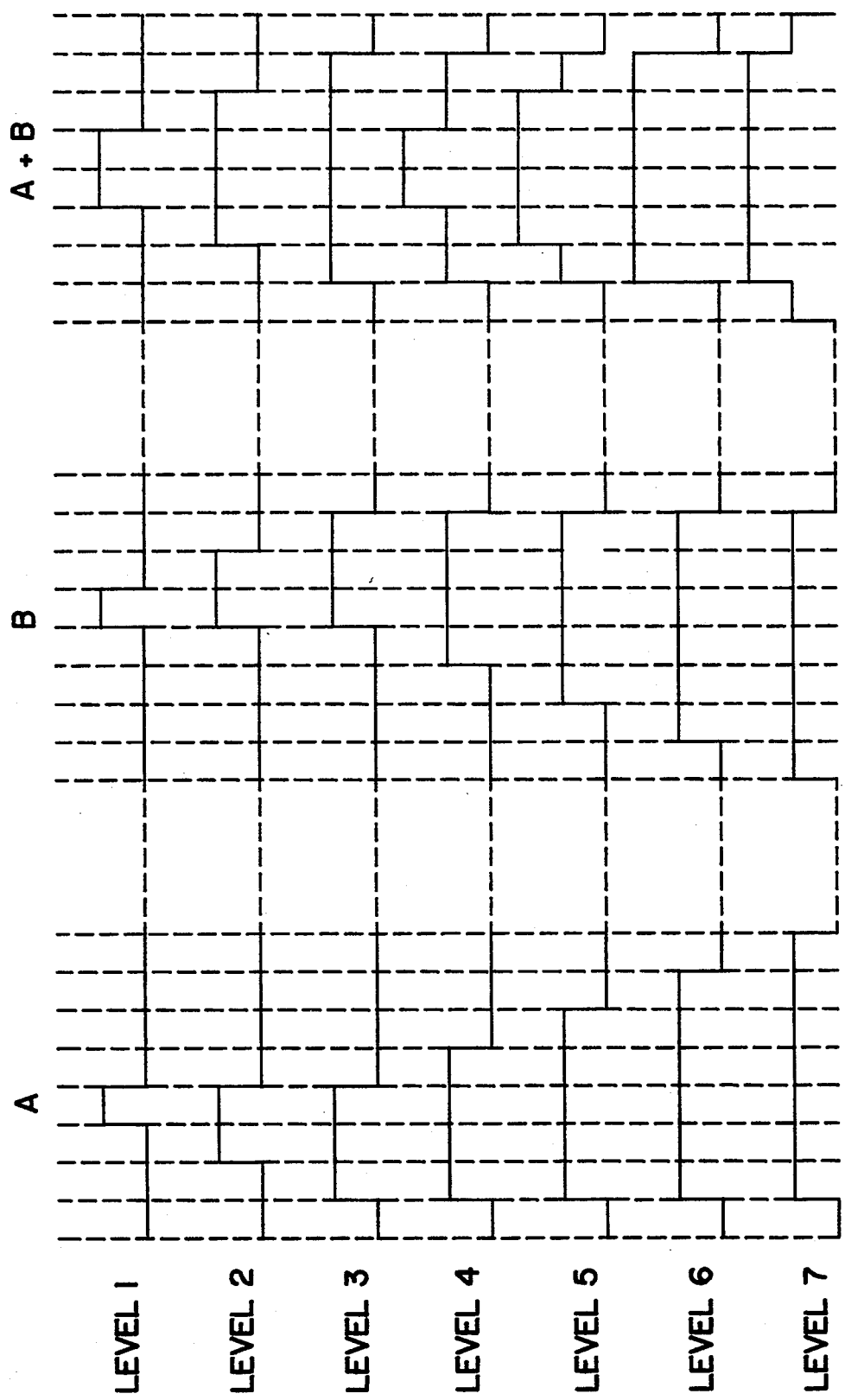
FIG. 5 is a diagrammatic representation of the contents of the ROM shown in FIG. 3 in accordance with a preferred embodiment of the present invention.

More particularly and referring to FIG. 5, ROM 72 contains indicia of a plurality of 8-bit output signals. In the illustrated embodiment, MSBs 2-4 are applied from quantizer 66 to demultiplexer 70; demultiplexer 70 thus comprises a 3-to-7 decoder, and ROM 72 comprises a 7×8 addressable ROM. As illustrated in column A of FIG. 5, each of the seven address locations within ROM 72 suitably correspond to seven different 8-bit energy levels. Based on the second, third, and fourth MSBs output from quantizer 60, one of the seven unique energy levels is selected from ROM 72 for application to the 1-bit DAC. (The significance of columns B and (A+B) of FIG. 5 is discussed below.)

Referring now to FIG. 6, in a preferred exemplary embodiment of a dual DAC is illustratively set forth in the context of a pulse width forming circuit 600. Pulse width forming circuit 600 suitably employs ROM 72 to produce an output signal, for application to the audio transducer, comprising a sequence of pulses centered within their respective pulse windows. In a particularly preferred embodiment, the input to noise shaper 60 comprises the output from a suitable digital interpolating (oversampling) filter 61, for example a finite impulse response (FIR) filter of the type set forth in commonly owned co-pending application Ser. No. 08/029,870 entitled "Digital-to-Analog Converter Including Integral Digital Audio Filter", filed on even date herewith.

Pulse width forming circuit 600 suitably comprises a shift left register 602, a shift right register 604, a first 1-bit DAC 608 cooperating with register 604, a second 1-bit DAC 610 cooperating with register 602, a summing junction 612, a filter 614, and an audio transducer (speaker) 616.

The 3-bit output from noise shaper 60 is suitably applied to demultiplexer 70 to select an appropriate voltage (pulse width) signal (see FIG. 5, column A) from ROM 72 as discussed above in connection with FIGS. 3 and 5. As also discussed above, noise shaper 60 suitably performs a 6× interpolation of the data which is input thereto (i.e., register 69 holds data for six cycles of operation of noise shaper 10). Thus, if filter 61 applies 8× interpolated data to noise shaper 60 at a frequency of 8 Fs, the 3-bit addresses are input to demultiplexer 70 at a rate of 48 Fs (8×6=48). ROM 72 thus outputs, in parallel, 8-bit words to shift registers 602 and 604 at a rate of 48 Fs.

Each 8-bit word output from ROM 72 is simultaneously applied to shift left register 602 and shift right register 604. Shift left register 602 shifts the data word resident therein, in 1-bit serial fashion, to the left and applies its contents to 1-bit DAC 610. Shift right register 604, on the other hand, shifts the 8-bit word resident therein to the right and applies the word to 1-bit DAC 608. The respective outputs of DACs 608 and 610 are summed by summer 612 whereupon the resulting sum is applied to low pass filter 614 and thereafter to speaker 616.

With continued reference to FIGS. 5 and 6, the output of shift right register 604 corresponds to column A in FIG. 5; the output of shift left register 602 corresponds to column B in FIG. 5. Moreover, for each respective address, the voltage values of the corresponding signal from column A (register 604) and column B (register 602) are equal; the column B signals correspond to an output word from ROM 72 which is shifted left, whereas the column A signals correspond to the same word shifted right. Consequently, each signal in column B represents the mirror image in time of the same signal in column A. That is, for a given digital signal, a shift left operation and a shift right operation will produce mirror images of that word.

Column A+B graphically illustrates that the summation of a particular signal from column A and the corresponding signal from column B results in a composite voltage signal which is centered within a pulse width window. Thus, when the outputs of DACs 608 and 610 are summed at summer 612, the resulting summation is necessarily symmetric about the center of a pulse width window; this results from the fact that columns A and B are time inverse mirror images of each other. By employing a shift left and a shift right (FIG. 6) operation on the output from ROM 72, the foregoing symmetrical output signal is produced using a single ROM.

In the foregoing preferred exemplary embodiment the voltage signals which are output from summer 612 are symmetric about the center of the sampling window. Moreover, the composite output signals are generally centered within each pulse window; consequently, the beginning and ending portions of each pulse window are characterized by a zero voltage amplitude. For high energy output signals (e.g., level 7), the amount of zero voltage "space" between each pulse would thus be very small. On the other hand, for low energy levels (e.g., level 1), the periods of zero voltage level between pulses would be relatively large. In any event, the presence of pronounced regions of zero amplitude, regularly interspersed between amplitude pulses, tends to generate harmonics corresponding to the frequency with which data words are output from ROM 72. While such high frequency harmonics (e.g., 48 Fs) would not typically be problematic in an audio context, in other PWM applications these harmonics, if present in lower frequency ranges, could have deleterious effects.

In particular, many applications employing PWM circuits (e.g., motor controls) utilize relatively low frequency pulses. The presence of regularly spaced, relatively large periods of zero voltage from the output of the dual DAC summer (or, indeed, from a single DAC) may degrade performance of the controller.

The present inventors have determined that the foregoing harmonics may be substantially reduced in the context of the present invention by reconfiguring the data within ROM 72.

More particularly and with momentary reference to FIG. 5, the output signals resident within ROM 72 (e.g., column A) tend to produce composite output signals (column A+B) which are not only centered about the center of a pulse window but which are also concentrated about the center of a pulse window. In an alternate preferred embodiment of the present invention, the output signals data resident in ROM 72 (corresponding to column A in FIG. 5) may be suitably reconfigured in any convenient matter such that the output signals do not comprise a continuous high logic pulse train. In particular, it may be advantageous to distribute a given energy level within a pulse window, for example as set forth in FIG. 8.

Figure 8:
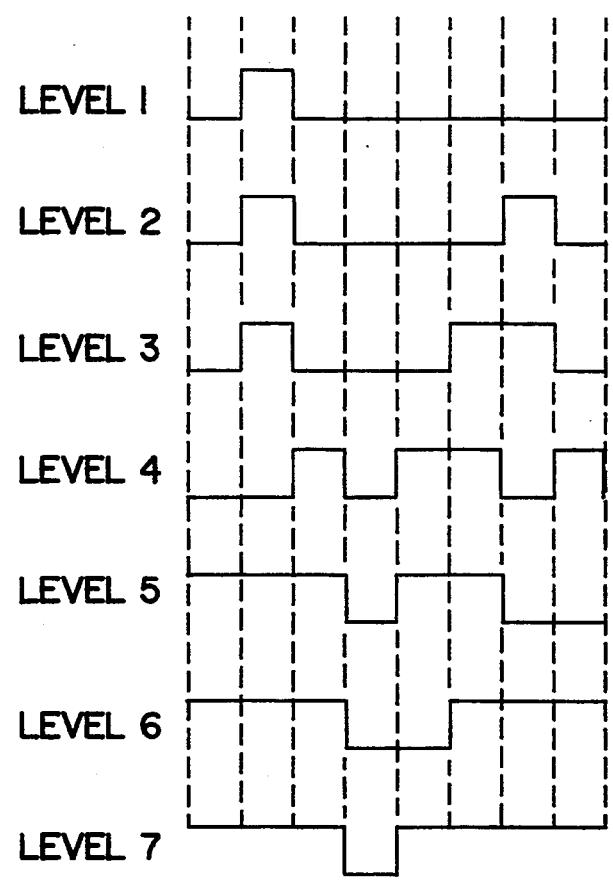
FIG. 8 is a diagrammatic representation of the contents of the ROM shown in FIG. 3 in accordance with an alternate embodiment of the present invention.

With reference to FIG. 8, it may be seen that each signal corresponding to a particular energy level comprises the same amount of energy as set forth in column A of FIG. 5. However, the high logic amplitude portions of the signals are not contiguous, and are generally randomly distributed within the pulse window.

With continued reference to FIGS. 6 and 8, the arrangement of FIG. 6 would nonetheless produce an output from summer 612 which is symmetric about the centroid of each pulse window even if ROM 72 comprised output voltage signals configured in accordance with FIG. 8. More particularly, since in the alternate preferred embodiment (FIG. 8) the data is nonetheless applied from ROM 72 to shift left register 602 and shift right register 604 as discussed above, mirror image outputs would nonetheless be generated from DACs 608 and 610. Accordingly, while the output signal from summer 612 would remain symmetric about the centroid of each pulse window, the voltage signals would be generally spread over the length of each pulse window. In this way, undesirable harmonics resulting from repetitive, evenly space zero voltage regions between pulse windows would be substantially reduced.

In accordance with a further aspect of the invention, ROM 72 may be augmented with or replaced by a programmable random number generator (not shown) whereby each time a particular address (e.g., corresponding to level 5) is applied to the number generator, an output voltage signal corresponding to energy level 5 is produced; however, the voltage distribution would be suitably randomly distributed within each pulse window.

Referring now to FIGS. 3 and 7, the four MSBs of the output signal from summer 64 (FIG. 3) represent sixteen possible quantization levels (left-hand column of FIG. 7). Typical prior art systems which utilize the four MSBs extracted by a quantizer apply the four MSBs to a 4 to 16 demultiplexer and thereafter select from among e.g., sixteen unique signals (e.g., 16-bit signals) from a 16×16 ROM. Alternatively, in prior art systems in which the quantizer extracts only the first three MSBs, the 3-bit address words are applied to a 3 to 8 demultiplexer and thereafter to an 8×8 ROM. The present inventors have determined that the computational complexity associated with such schemes may be greatly reduced by appropriately scaling the data which is input to first summer 64 while still meeting required performance specifications.

More particularly, scaling module 62 suitably comprises a mechanism for effectively multiplying each data word applied thereto by a predetermined constant coefficient K. In the context of the present invention wherein multiplierless architecture is preferred, such "multiplication" may be carried out through a shift-and-add process.

The present inventors have further determined that the selection of an appropriate constant coefficient K ensures that adder 64 will not exceed its capacity (i.e., will not overflow). In a particularly preferred embodiment, a value of K=0.25 is employed, which is equivalent to shifting each 20-bit data word input to scaler 62 to the right by two bits. Consequently, the two most significant bits of each data word output from scaler 62 comprise "sign extensions" of the corresponding unscaled data; that is, if the unscaled data was positive (expressed in 2's complement format), the two MSBs of the scaled data are zeros; if the unscaled data was negative, the two MSBs of the scaled data are ones. Scaling the data in foregoing manner effectively limits the value of the MSBs extracted by quantizer 66 to the mid-range region of the available addresses (i.e., column "3 to 7" of FIG. 7).

More particularly and with reference to FIG. 7, the data applied to noise shaper 60, as well as all data typically operated upon in the context of audio data processing, is typically maintained in a 2's complement format. Indeed, digital audio data is typically stored on CD ROM in 2s complement to facilitate the reconstruction of the complex bipolar wave forms from which the original digital data was extracted and stored on CD ROM. The use of a 2's complement format is particularly appropriate when it is desirable to process and replicate data which comprises data points having values both greater than and less than zero, e.g., audio wave forms. As shown in FIG. 7, the mid-scale value of 0000 represents the 0 voltage level; the values above the 0000 baseline represent increasingly higher positive data values (set forth in 2's complement format). The data values below the 0000 baseline represent increasing negative magnitudes (in 2's complement format).

By scaling the data which is input to scaler 62 in the manner discussed above, the 4-bit coarsely quantitized data extracted by quantizer 66 is limited to the mid-range values identified in FIG. 7. In other words, by selecting an appropriate scaling coefficient K (e.g., K=0.25), the first five and the last four 4-bit coarsely quantitized data words set forth in the left-hand column of FIG. 7 will simply never be extracted by quantizer 66; conversely, each 4-bit coarsely quantitized data word extracted by quantizer 66 necessarily corresponds to one of the mid-range values identified in FIG. 7.

The present inventors have further noted that for the mid-range values identified in FIG. 7, the first two MSBs are always identical; thus, it is sufficient to apply only three of the four MSBs extracted by quantizer 66 to demultiplexer 70, thereby reducing its complexity. In the context of a preferred embodiment of the present invention, only MSBs 2, 3, and 4 need be applied to demultiplexer 70.

Although the invention has been described herein in conjunction with the appended drawings, the scope of the invention is not so limited. For example, the noise shaper of the present invention receives its input data from the output of a digital filter, the coefficients of such a digital filter may suitably be selected to appropriately scale the data which is input to the noise shaper, thereby eliminating the need for a separate scaling module at the input of the noise shaper. These and other changes may be made in the design and arrangement of the components and steps discussed herein without departing from the spirit of the invention as set forth in the appended claims.

We claim:

1. A dual DAC, comprising:
    a ROM containing a plurality of addressable output signals;
    a shift left register configured to receive one of said output signals from said ROM at time $t_0$;
    a shift right register configured to receive said one of said output signals from said ROM at time $t_0$;
    a first one bit DAC configured to receive a left shifted output from said shift left register at time $t_1$ following time $t_0$;
    a second one bit DAC configured to receive a right shifted output from said shift right register at time $t_1$; and
    an analog summer configured to receive the respective outputs of said first and second one bit DACs at time $t_2$ following time $t_1$, said summer being further configured to generate an output signal indicative of the sum of the outputs from said first and second one bit DACs.

2. The dual DAC of claim 1, wherein said left shifted output from said shift left register comprises the mirror image in time of said right shifted output from said shift right register.

3. The dual DAC of claim 1, further comprising clock means, cooperating with each of said ROM, said shift left register, said shift right register, said first one bit DAC, and said second one bit DAC, for controlling the simultaneous application of said one of said output signals from said ROM to each of said shift left register and said shift right register and for controlling the simultaneous application of said left shifted output and said right shifted output to said first one bit DAC and said second one bit DAC, respectively.

4. The dual DAC of claim 3, wherein said clock means is further configured to control, during each of a plurality of successive computational periods P of said DAC, the simultaneous application of said left shifted output from said first one bit DAC to said analog summer and said right shifted output from said second one bit DAC to said analog summer.

5. The dual DAC of claim 4, wherein said output signal from said analog summer is symmetrically centered within said period P.

6. The dual DAC of claim 1, wherein each of said plurality of addressable output signals within said ROM comprises an output signal having a predetermined voltage distribution.

7. The dual DAC of claim 1, wherein each of said plurality of addressable output signals within said ROM comprises a predetermined voltage value, wherein said voltage value is randomly distributed within a pulse window.

8. The dual DAC of claim 1, further comprising a low pass filter connected to the output of said analog summer and configured to filter said output signal from said analog summer.

9. The dual DAC of claim 8, further comprising an audio transducer, and wherein said filter is further configured to generate a filtered signal and to apply said filtered signal to said audio transducer.

10. The dual DAC of claim 1, further comprising:
    a noise shaper circuit; and
    a demultiplexer configured to receive an output from said noise shaper circuit and to select one of said plurality of addressable output signals from said ROM in accordance with said noise shaper circuit output.

11. The dual DAC of claim 10, wherein:
said noise shaper circuit is configured to apply N significant bits to said demultiplexer;
said demultiplexer comprises an N by M demultiplexer; and
said ROM comprises M of said addressable output signals.

12. The dual DAC of claim 1, wherein each of said plurality of addressable output signals has a unique logical value associated therewith.

13. The dual DAC of claim 1, wherein said ROM, said shift left register, said shift right register, said first one bit DAC, and said second one bit DAC are configured such that said one of said output signals is applied from said ROM to each of said shift left register and said shift right register in parallel fashion, and wherein said left shifted output is applied to said first one bit DAC, and said right shifted output is applied to said second one bit DAC in serial fashion.

14. The dual DAC of claim 13, wherein the respective outputs of said first and second one bit DACs are applied to said analog summer in serial fashion.

* * * * *